(12) United States Patent
Chai et al.

(10) Patent No.: US 11,152,801 B2
(45) Date of Patent: Oct. 19, 2021

(54) ENERGY LEVEL CONVERSION CIRCUIT FOR PORTABLE ENERGY STORAGE APPARATUS

(71) Applicant: ENERCAMP CO., LTD., Daegu (KR)

(72) Inventors: Yong Yoong Chai, Daegu (KR); Sang Deok Choi, Daegu (KR); Jungsub Choi, Daegu (KR)

(73) Assignee: ENERCAMP CO., LTD., Daegu (KR)

(\*) Notice: Subject to any disclaimer, the term of this patent is extended or adjusted under 35 U.S.C. 154(b) by 246 days.

(21) Appl. No.: 16/340,322

(22) PCT Filed: Dec. 6, 2018

(86) PCT No.: PCT/KR2018/015396
§ 371 (c)(1),
(2) Date: Apr. 8, 2019

(87) PCT Pub. No.: WO2019/151634
PCT Pub. Date: Aug. 8, 2019

(65) Prior Publication Data
US 2021/0091579 A1 Mar. 25, 2021

(30) Foreign Application Priority Data
Feb. 5, 2018 (KR) .................. 10-2018-0013955

(51) Int. Cl.
*H05K 1/14* (2006.01)
*H02J 7/00* (2006.01)
(Continued)

(52) U.S. Cl.
CPC ............ *H02J 7/0042* (2013.01); *H02J 7/007* (2013.01); *H02M 1/08* (2013.01); *H02M 1/34* (2013.01);
(Continued)

(58) Field of Classification Search
CPC ...... H02J 7/0042; H02J 7/007; H02J 2207/20; H02M 1/08; H02M 1/34; H02M 3/335;
(Continued)

(56) References Cited

U.S. PATENT DOCUMENTS

| 6,964,574 B2* | 11/2005 | Pavesi | ...................... H05K 1/14 |
| | | | 439/76.1 |
| 7,027,305 B2* | 4/2006 | Keating | .................. H01R 12/52 |
| | | | 361/719 |

(Continued)

FOREIGN PATENT DOCUMENTS

| JP | 5-252657 A | 9/1993 |
| KR | 20-0190917 Y1 | 8/2000 |

(Continued)

*Primary Examiner* — Dinh T Le
(74) *Attorney, Agent, or Firm* — Novick, Kim & Lee, PLLC; Sang Ho Lee (57) ABSTRACT

Provided is an energy level conversion circuit for a portable energy storage apparatus, and includes a motherboard circuit to connect a plurality of sub-board circuits in series through female connectors, wherein the sub-board circuits receive input of direct current (DC) power, convert it to a preset energy level and output it, and the sub-board circuits connected or inserted into the motherboard circuit through the female connectors, and including a switching unit which is switched by a pair of switching pulses (P1, P2) applied from the motherboard circuit, so that when each switching transistor (Q1, Q2) is on/off, power transformed through a transformer is outputted through secondary side transformer tap connection terminals (T1, T2), wherein the sub-board circuits are connected in series through a female connector unit of the motherboard circuit, so that DC power whose energy level is converted as much as the number of the sub-board circuits is outputted through the motherboard circuit.

10 Claims, 7 Drawing Sheets

(51) Int. Cl.
    *H02M 1/08*      (2006.01)
    *H02M 1/34*      (2007.01)
    *H02M 3/335*     (2006.01)
    *H05K 1/18*      (2006.01)
(52) U.S. Cl.
    CPC .............. *H02M 3/335* (2013.01); *H05K 1/14* (2013.01); *H05K 1/18* (2013.01); *H02J 2207/20* (2020.01); *H05K 2201/10189* (2013.01)
(58) Field of Classification Search
    CPC ... H05K 1/24; H05K 1/18; H05K 2201/10189
    See application file for complete search history.

(56) References Cited

U.S. PATENT DOCUMENTS

| | | | |
|---|---|---|---|
| 7,508,838 B2 * | 3/2009 | Kim ................ | H04L 49/351 370/419 |
| 10,341,602 B2 * | 7/2019 | Yu ................... | H02M 3/33523 |
| 10,630,181 B2 * | 4/2020 | Zeng ................ | H02M 3/1588 |

FOREIGN PATENT DOCUMENTS

| | | |
|---|---|---|
| KR | 20-2012-0000788 U | 2/2012 |
| KR | 10-2013-0096279 A | 8/2013 |
| KR | 10-2014-0120025 A | 10/2014 |
| KR | 10-2014-0140108 A | 12/2014 |

\* cited by examiner

ENERGY LEVEL CONVERSION CIRCUIT FOR PORTABLE ENERGY STORAGE APPARATUS

TECHNICAL FIELD

The present disclosure relates to an energy level conversion circuit for a portable energy storage apparatus, and more particularly, to an energy level conversion circuit for a portable energy storage apparatus that boosts energy stored in a battery or a portable energy storage apparatus or energy produced through a solar cell to a desired level and converts it to alternating current (AC) power with an aim of using various types of electronic products that operates with AC power.

BACKGROUND

In general, various types of electronic products including electric/electronic devices requiring power are supplied with commercial alternating current (AC) power (e.g., AC 1220V) supplied from an electricity company (e.g., Korean Electric Power Corporation) by being connected to outlets equipped in homes or offices. Also, electronic devices may be supplied with direct current (DC) power using integrally or separably mounted batteries in a place where commercial AC power is not supplied, Recently, with the growing social interest in outdoor activities, there is an increasing demand for operating various types of electronic products using batteries. Recently, people are enjoying outdoor activities such as camping, fishing and caravanning which dramatically increased with the growing interest in outdoor activities, and as the trend moves toward family focused outdoor activities, such as camping, there is a greater tendency to use various types of electronic products using commercial power outdoors.

Accordingly, there is an increasing demand for DC/AC inverters to produce commercial AC power (e.g., AC 1220V) using DC power (e.g.: DC 12V) of batteries (or solar cells). In this instance, the inverter serves to convert DC to AC, and before DC to AC conversion, a DC/DC converter (i.e., an energy level converter) is necessary to amplify (or boost) (e.g., DC 400V) the DC power level of the battery (or solar cell). Here, the DC/DC converter (i.e., the energy level converter) and the DC/AC inverter may be collectively referred to as an energy conversion device.

However, because the energy conversion device is mainly necessary for outdoor activities, the energy conversion device preferably needs to be small (or low) in volume and weight as much as possible and needs to be configured to change the power (or energy) level to a desired level in an easy and simple way in order to respond to various types of electronic products with different power (or energy) levels. Therefore a proper design of a suitable energy level conversion circuit is definitely necessary.

The background art of the present disclosure is disclosed in Korean Utility Mode Publication No. 20-2012-0000788 (published Feb. 2, 2012, titled Portable DC/AC power supply unit).

SUMMARY

The present disclosure is designed to solve the problem such as those described above, and therefore the present disclosure is directed to providing an energy level conversion circuit for a portable energy storage apparatus that boosts energy stored in a battery or a portable energy storage apparatus or energy produced through a solar cell to a desired level and converts it to alternating current (AC) power with an aim of using various types of electronic products that operates with AC power.

According to an exemplary embodiment, there is provided an energy level conversion circuit for a portable energy storage apparatus, including: a motherboard circuit including a female connector unit having one or more female connectors to connect a plurality of sub-board circuits through the female connector unit, wherein the sub-board circuits receive input of direct current (DC) power, convert it to a preset energy level and output it; and the sub-board circuits including a male connector unit connected to each female connector of the female connector unit, and a switching unit including a plurality of switching transistors $Q_1$, $Q_2$ which is on/off when receiving a pair of switching pulses $P_1$, $P_2$ applied from the motherboard circuit, so that when each switching transistor $Q_1$, $Q_2$ is on/off, power transformed through a transformer connected to the switching pulses $P_1$, $P_2$ is outputted through transformer tap connection terminals of the secondary side $T_1$, $T_2$ of the female connectors.

The sub-board circuits may be connected in series through the female connector unit of the motherboard circuit, so that DC power whose energy level is converted as much as the number of the sub-board circuits may be outputted through the motherboard circuit.

The motherboard circuit may include a switching pulse generation unit to generate the pair of switching pulses $P_1$, $P_2$, and the switching pulses may be pulses having opposite switching on/off ranges to switch each switching transistor $Q_1$, $Q_2$ in an alternating manner.

The pair of switching pulses $P_1$, $P_2$ may be applied to the sub-board circuits connected to each female connector, and each female connector may include a terminal for receiving input of each of the pair of switching pulses $P_1$, $P_2$, a terminal for receiving input of battery power, and the transformer tap connection terminals of the secondary side $T_1$, $T_2$.

The transformer tap connection terminals of the secondary side $T_1$, $T_2$ may be connected in series through the female connectors of the motherboard circuit, and the first transformer tap connection terminal of the secondary side $T_1$ of a first female connector of the plurality of female connectors may be connected to a first input terminal of a rectification unit formed in the motherboard circuit, the second transformer tap connection terminal of the secondary side of the first female connector may be connected to the first transformer tap connection terminal of the secondary side $T_1$ of a second female connector, the second transformer tap connection terminal of the secondary side $T_2$ of the second female connector may be connected to the first transformer tap connection terminal of the secondary side $T_1$ of a third female connector, and the second transformer tap connection terminal of the secondary side $T_2$ of the third female connector may be connected to a second input terminal of the rectification unit.

The rectification unit may wave-rectify voltage outputted through the first transformer tap connection terminal of the secondary side $T_1$ of the first female connector and the second transformer tap connection terminal of the secondary side $T_2$ of the third female connector, and output DC power whose energy level is converted by the sub-board circuits through a boosted power output unit formed in the motherboard circuit.

The pair of switching pulses P1, P2 may be applied to gates of each switching transistor Q1, Q2, and a snubber circuit may be connected to drains of each switching transistor Q1, Q2.

Each switching transistor Q1, Q2 may be a MOS transistor, the drains of each switching transistor Q1, Q2 may be each connected to a first transformer tap of the primary side t1 and a second transformer tap of the primary side t2 of the transformer, and sources of each switching transistor Q1, Q2 may be grounded.

The transformer may be a transformer which applies battery power to a center tap of the primary side ct of the transformer to allow the battery power applied to the center tap ct through a first transformer tap of the primary side t1 and a second transformer tap of the primary side t2 of the transformer to flow through a first switching transistor Q1 or a second switching transistor Q2, and outputs wave voltage through the first transformer tap connection terminal of the secondary side T1 of the female connector and the second transformer tap connection terminal of the secondary side T2 of the female connector.

The sub-board circuits may be connected in parallel through the female connector unit of the motherboard circuit, so that DC power whose energy level is converted as much as a sum of capacity of each sub-board circuit connected in parallel may be outputted through the motherboard circuit.

According to an aspect of the present disclosure, the present disclosure can boost energy stored in a battery or a portable energy storage apparatus or energy produced through a solar cell to a desired level. Additionally, the present disclosure can change the power (or energy) level to a desired level in an easy and simple way to respond to various types of electronic products with different operating power levels, and when an error occurs in the sub-board, can solve the error in an easy and simple way through exchange.

DETAILED DESCRIPTION OF EMBODIMENTS

Hereinafter, an embodiment of an energy level conversion circuit for a portable energy storage apparatus according to the present disclosure will be described in detail with reference to the accompanying drawings.

In this process, the thickness of the lines and the size of the components shown in the drawings may be exaggerated for clarity and convenience of description. In addition, the following terms are defined considering the functions in the present disclosure and may change depending on the intention of a user or an operator or the convention. Therefore, these terms should be defined based on the description throughout the specification.

Figure 1:
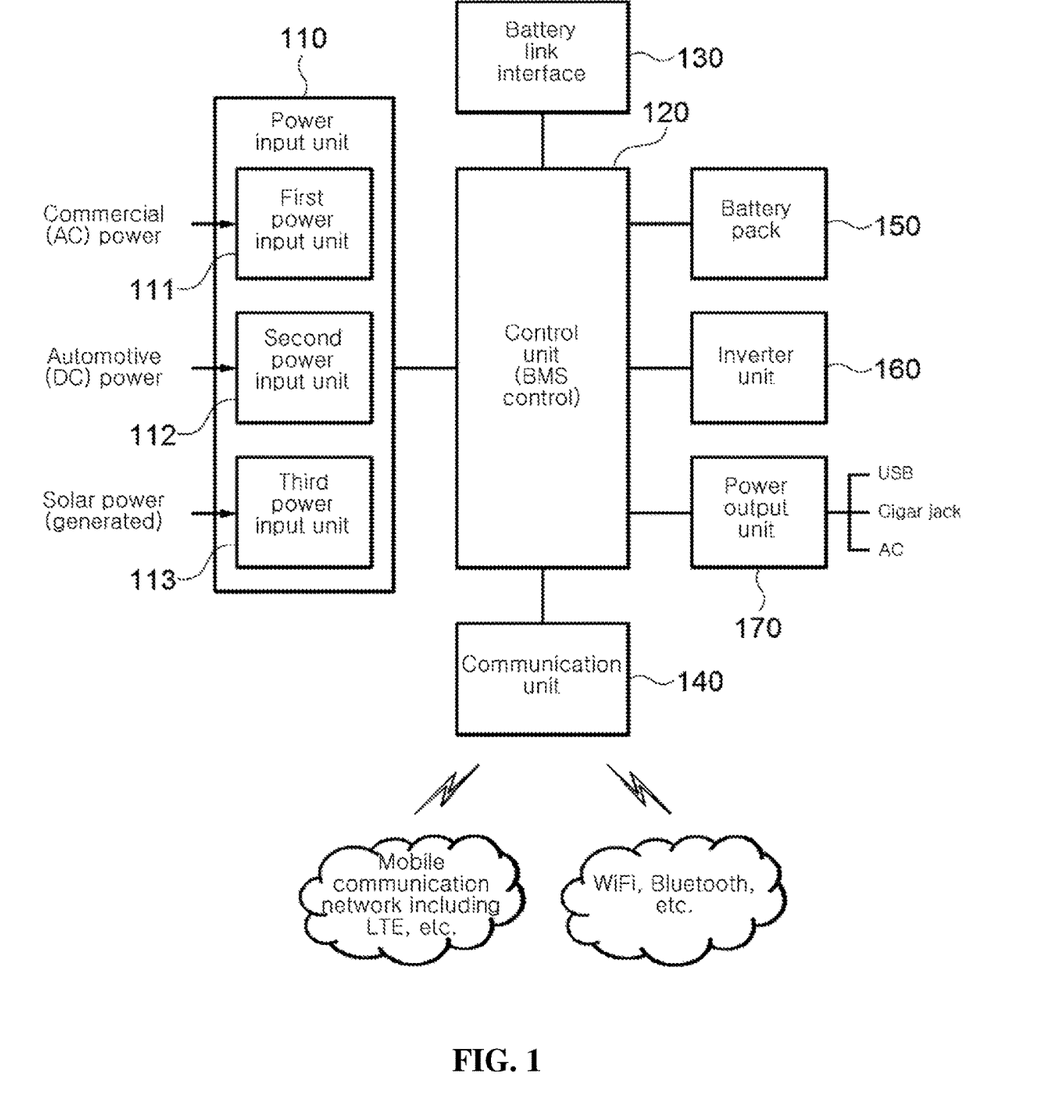
FIG. 1 is an exemplary diagram showing a schematic configuration of a portable energy storage apparatus according to a first embodiment of the present disclosure.

FIG. 1 is an exemplary diagram showing a schematic configuration of a portable energy storage apparatus according to a first embodiment of the present disclosure.

As shown in FIG. 1, the portable energy storage apparatus according to the first embodiment includes a power input unit 110, a control unit 120, a battery link interface unit 130, a communication unit 140, a battery pack 150, an inverter unit 160 and a power output unit 170.

The power input unit 110 may receive the input of power for charging the battery through at least three power sources (e.g., commercial power, automotive power, and solar power, etc.). Accordingly, the power input unit 110 may include power input units 111, 112, 113 for each power source.

Although not shown in detail in the drawing, the power input unit 110 may operate as a direct current (DC)-DC converter and an alternating current (AC)-DC converter. That is, the power input unit 110 may convert the inputted power (AC, DC) to a preset level of DC power.

The power output unit 170 includes output terminals for connecting power adapters (or power terminals) of various loads (e.g., a laptop PC, mobile communication terminal, smartphone, and tablet PC, etc.), and outputs rated power (e.g., DC 5V, DC 12V, DC 16V, DC 19V, DC 24V, 110V AC, 220V AC, etc.) corresponding to each output terminal.

The control unit 120 charges the battery pack 150 using the power inputted through the power input unit 110. In this instance, the control unit 120 performs Battery Management System (BMS) control for stable charging.

Additionally, the control unit 120 may operate based on Internet of Things (IoT). That is, the control unit 120 may act as a smart hub by allowing a user to check and notify the state of charge of the battery using a portable terminal (e.g., a smartphone or tablet PC, etc.), and by accessing a communication network (e.g., a mobile communication network, etc.) to provide a wireless Internet (e.g., WiFi, etc.) signal to the nearby devices.

Figure 4:
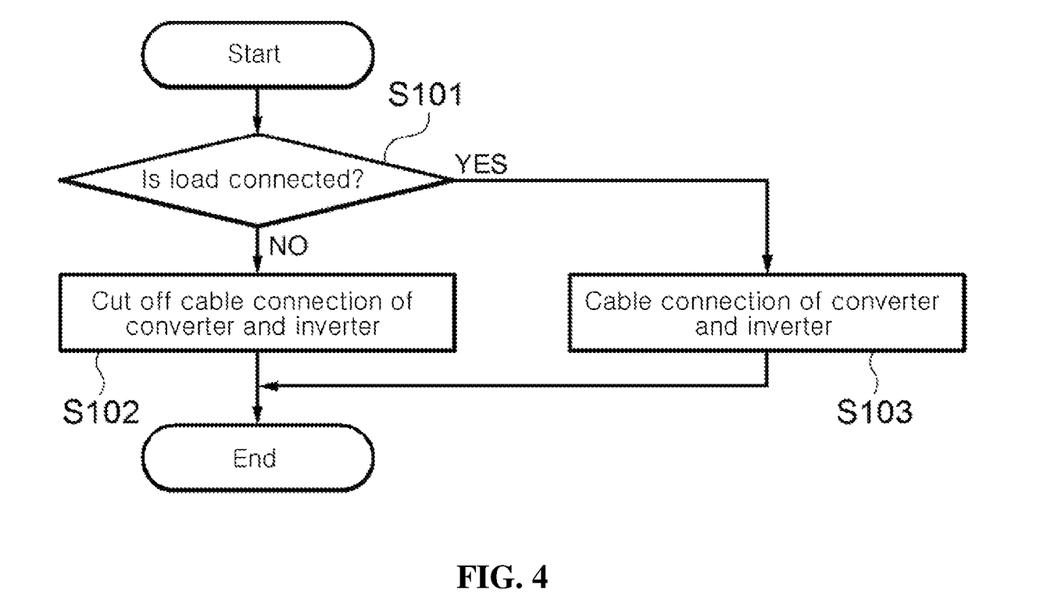
FIG. 4 is a flowchart illustrating, in FIG. 2, an operation in which a control unit cuts off or maintains cable connection depending on whether a load is connected.

Additionally, the control unit 120 may check whether a load is applied (connected) to the power output unit 170, and cut off or maintain the internal cable connection (e.g., cable connection of a DC-DC converter, AC-DC converter, or inverter, etc.) of the portable energy storage apparatus according to this embodiment through a cable connection switching unit (190 in FIG. 2) (See also FIG. 4).

Here, the BMS control performed by the control unit 120 includes overcharge prevention, overdischarge prevention, overcurrent prevention, cell balancing and temperature sensing functions for the battery pack 150. A sensor (not shown) may be included to detect information related to the corresponding function.

The battery link interface unit 130 is an interface for additionally connecting the portable energy storage apparatus according to this embodiment, an additional battery pack, or an auxiliary battery pack. For example, an auxiliary battery pack may be additionally connected and charged, or a charged auxiliary battery pack may be additionally connected and discharged (outputted) to the load.

The inverter unit 160 may generate pure sine wave AC power (e.g.: 110V AC, 220V AC, etc.) out of the inputted DC power.

The control unit 120 may control the operation of the inverter unit 160.

Additionally, the control unit 120 may include an information input/output unit (180 in FIG. 2) to output operational state information of the portable energy storage apparatus according to this embodiment. When the user selects desired operational state information using a button or a switch, the information input/output unit (180 in FIG. 2) outputs the selected operational state information.

The information input/output unit (180 in FIG. 2) may use a selective combination of a Liquid Crystal Display (LCD), Seven-Segment (FND) and Light Emitting Diode (LED) to output the information.

Additionally, the control unit 120 uses a feedback control to control the inverter unit 160. In this instance, elements of a power circuit including the inverter unit 160 have an allowable error occurring by the fabrication process and environmental factors, and the output of the power circuit has a particular distribution due to the error of the elements. Therefore, because the output distribution of the power circuit should be in a predefined range, the feedback control is essential.

Meanwhile, a secondary battery (i.e., the battery pack) basically embedded in the portable energy storage apparatus according to this embodiment can be attached and detached, making it easy to install an auxiliary battery module.

The communication unit 140 includes a wireless Internet module. For example, the communication unit 140 accesses an Internet network through a mobile communication network (e.g., Long-Term Evolution (LTE), etc.), and provides an Internet access service to nearby devices accessed through WiFi. However, the communication method is not limited to WiFi, and the communication unit 140 may provide the Internet access service by other communication methods (e.g., Bluetooth).

For instance, the portable energy storage apparatus according to this embodiment enables a Location Based Service (LBS) (e.g., locating in real time to prevent a missing child, avoid getting lost, as well as detecting connection between a smartphone and an Energy Storage System (ESS) to prevent theft), home networking (e.g., file sharing between users in a group through data transmission using a home gateway, and entertainment function through file sharing using a home gateway) and IoT (e.g., provide information such as ESS state and indoor/outdoor temperature/humidity to the user through surrounding environment sensing, turn on the LED light when it is dark to provide convenience to the user, and control ESS power using a smartphone) through the wireless Internet access service.

Furthermore, an application (e.g., Management APP) installed in the user's portable terminal (e.g., a smartphone or tablet PC, etc.) may manage an ESS to which a smartphone can connect, monitor and control state information of the ESS, provide location information of the ESS and the connected terminal, and provide an additive service through surrounding environment sensing.

Next, describing the BMS control function in more detail, the control unit 120 monitors the voltage, current, and temperature during charging/discharging of the battery as the battery monitoring function, and performs State of Charge (SOC) and State of Health (SOH) function.

Here, SOC is information that indicates the state of charge of the battery in %, SOH is information that evaluates the level of capacity of the battery that has been degraded until now, and State of Life (SOL) is information that predicts the end of life or evaluates a remaining cycle or time based on SOH.

Additionally, the control unit 120 performs protection function such as management for safety of the battery and overcharge prevention, and in the event of overdischarge, overcurrent and short, turns off an external switch (not shown) and performs a system diagnosis and a data history management function.

Furthermore, in this embodiment, the battery pack 150 needs to optimally design a heat sink (not shown) to maximize heat dissipation and diffusion, taking heat dissipation and diffusion into account. A large amount of heat is generated from the inside of a battery pack into which a few tens to a few hundreds of cells are usually modularized. I If thermal design is improper, the battery pack may explode or an electrolyte solution may leak during operation. Therefore, the design of a heat sink is very important to battery life as well as stability. For example, quick charge/discharge applies stress to the battery by causing heat generation, and at the same time, degrades the battery life. Heat generation caused by contact resistance should be taken into account as well.

Figure 2:
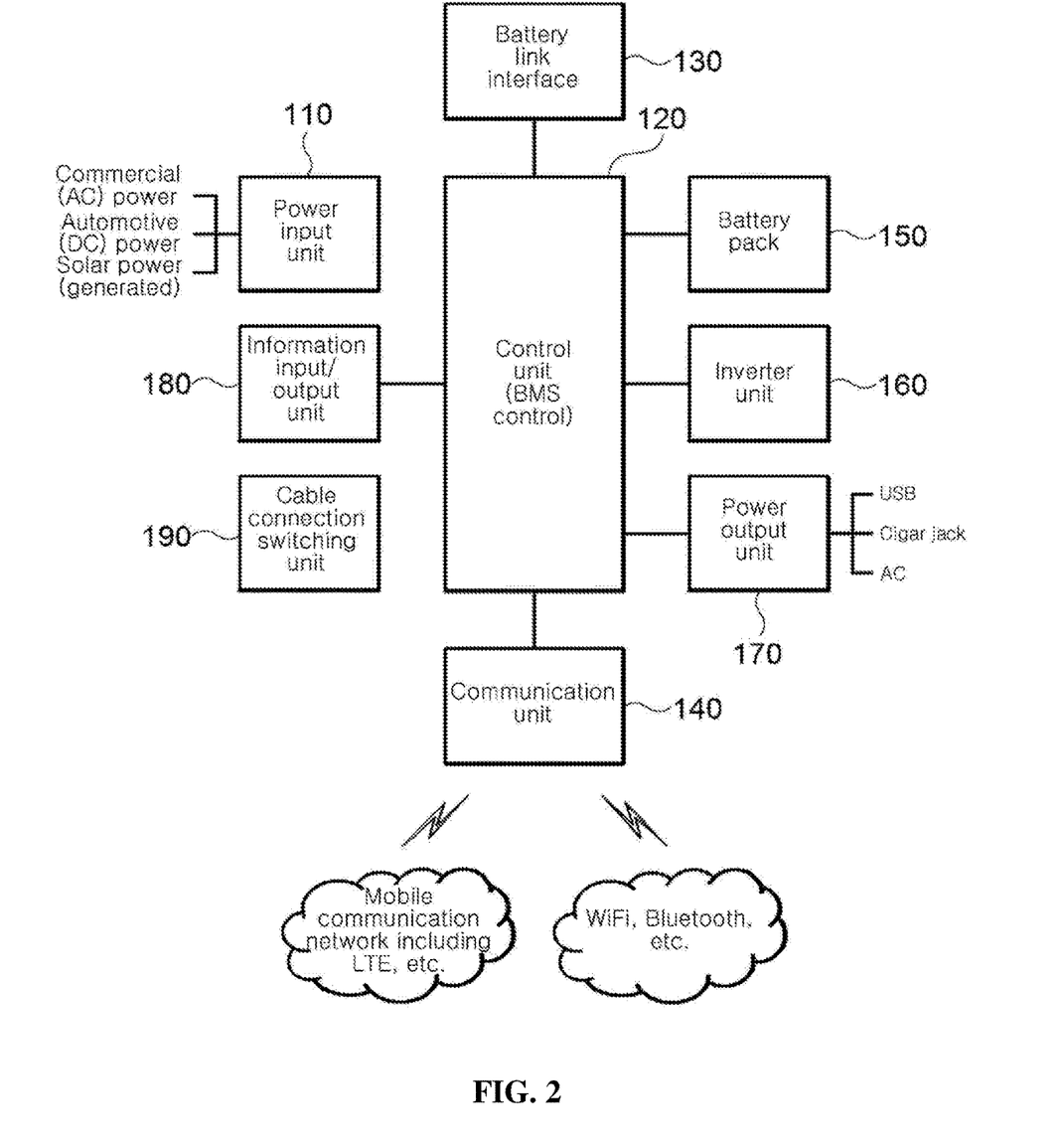
FIG. 2 is an exemplary diagram showing a schematic configuration of a portable energy storage apparatus according to a second embodiment of the present disclosure.

FIG. 2 is an exemplary diagram showing a schematic configuration of a portable energy storage apparatus according to the second embodiment of the present disclosure.

As shown in FIG. 2, the portable energy storage apparatus according to the second embodiment further includes, in FIG. 1, an information input/output unit 180 and a cable connection switching unit 190.

The information input/output unit 180 includes a button or a switch as a means for receiving the input of the user's desired operational state information, and includes an LCD, seven-segment (FND), and LED as a means for outputting the operational state information selected by the button or the switch.

Additionally, the cable connection switching unit 190 checks whether a load is applied (connected) to the power output unit 170 under the control of the control unit 120, and cuts off or maintains the internal cable connection (e.g., cable connection of a DC-DC converter, AC-DC converter, or inverter, etc.) of the portable energy storage apparatus according to this embodiment.

It is possible to improve safety by cutting off or maintaining the internal cable connection (e.g., cable connection of a DC-DC converter, AC-DC converter, or inverter, etc.) of the portable energy storage apparatus according to this embodiment through the cable connection switching unit 190.

Figure 3:
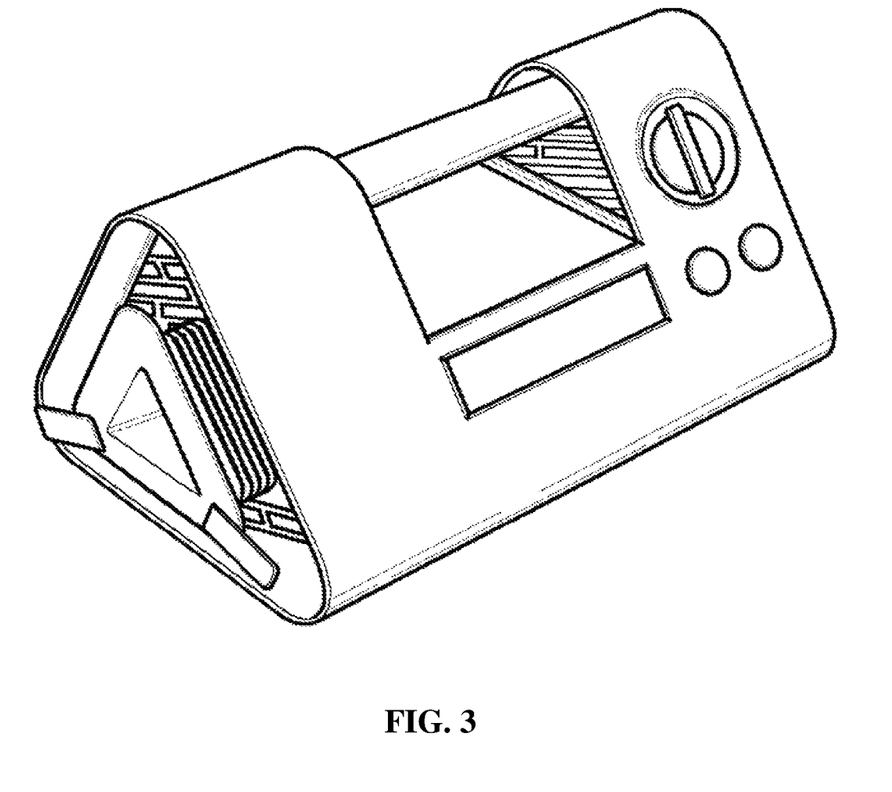
FIG. 3 is an exemplary diagram showing a schematic external shape of a portable energy storage apparatus according to an embodiment of the present disclosure.

FIG. 3 is an exemplary diagram showing a schematic external shape of the portable energy storage apparatus according to an embodiment of the present disclosure.

As shown in FIG. 3, the portable energy storage apparatus according to this embodiment is formed in the shape of a triangular prism to maintain a stable pose without movement, has a handle on top, and includes, on one side, at least one input means (e.g., a button or a switch for selecting the operation or operational state display) and output means (e.g., an LCD, seven-segment (FND), or LED) for outputting operational state information.

Additionally, the portable energy storage apparatus may have, on the other side, an embedded cable for connecting the input power source or the output load.

Meanwhile, it is noted that the portable energy storage apparatus shown in FIG. 3 is shown to help an understanding of this embodiment, but not intended to limit the shape.

FIG. 4 is a flowchart illustrating, in FIG. 2, an operation in which the control unit cuts off or maintains cable connection depending on whether a load is connected.

As shown in FIG. 4, the control unit 120 checks whether a load is applied (connected) to the power output unit 170 (S101).

As a result of the checking (S101), when a load is not connected to the power output unit 170 (NO in S101), the control unit 120 cuts off the internal cable connection (e.g., cable connection of a DC-DC converter, an AC-DC converter, or an inverter, etc.) of the portable energy storage apparatus according to this embodiment through the cable connection switching unit 190 (S102).

On the contrary, as a result of the checking (S101), when a load is connected to the power output unit 170 (YES in S101), the control unit 120 maintains the internal cable connection (e.g., cable connection of a DC-DC converter, AC-DC converter, or inverter, etc.) of the portable energy storage apparatus according to this embodiment through the cable connection switching unit 190 (S103).

As described above, this embodiment has an effect in preventing the battery consumption by cutting off the connection of a particular internal cable (e.g., a cable of an inverter) depending on whether a load is connected or not.

Hereinafter, in this embodiment, the energy level conversion circuit corresponds to the DC-DC converter circuit in the portable energy storage apparatus, and the energy level conversion circuit for a portable energy storage apparatus is described in detail with reference to FIGS. 5 and 6.

Figure 5:
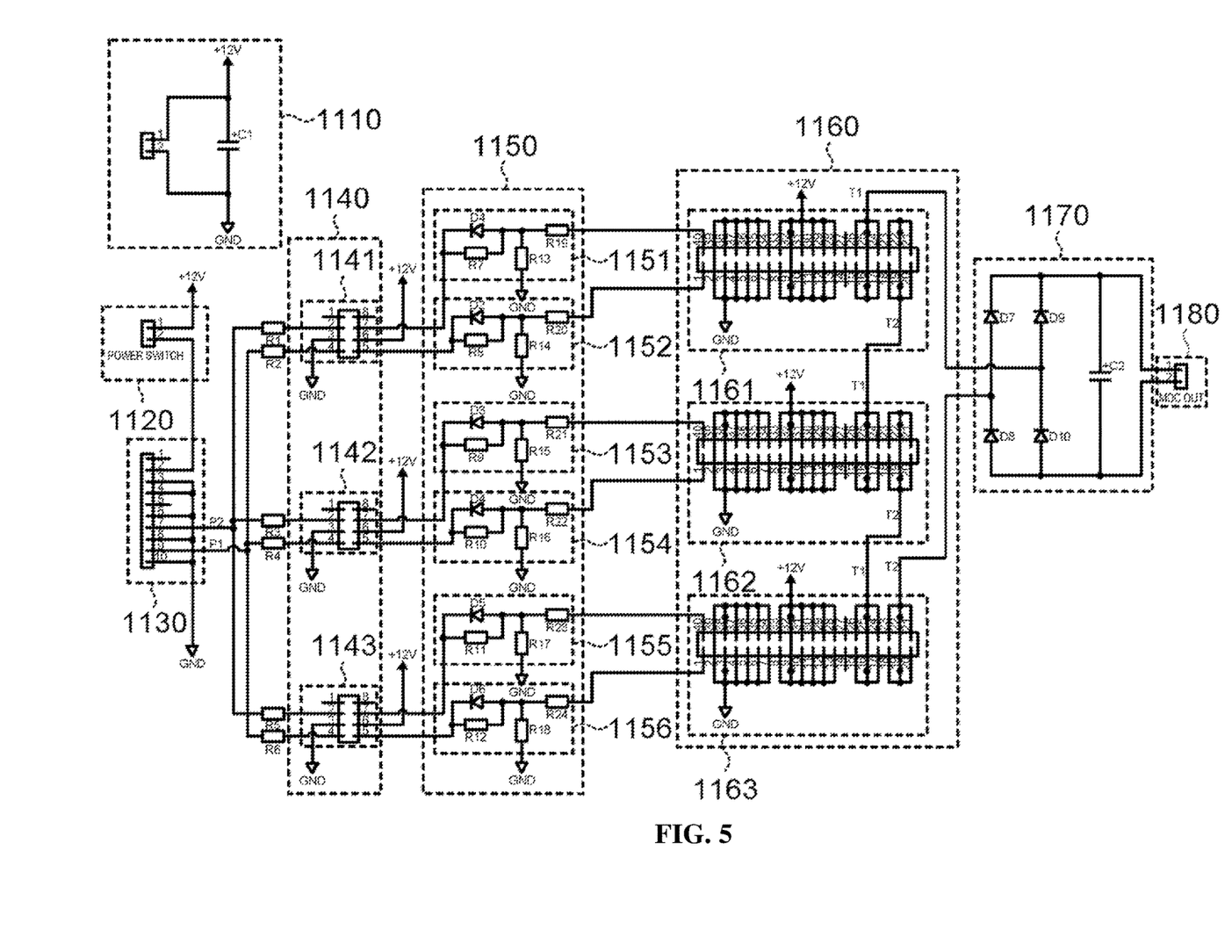
FIG. 5 is an exemplary diagram showing a motherboard circuit of an energy level conversion circuit for a portable energy storage apparatus according to an embodiment of the present disclosure.
Figure 6:
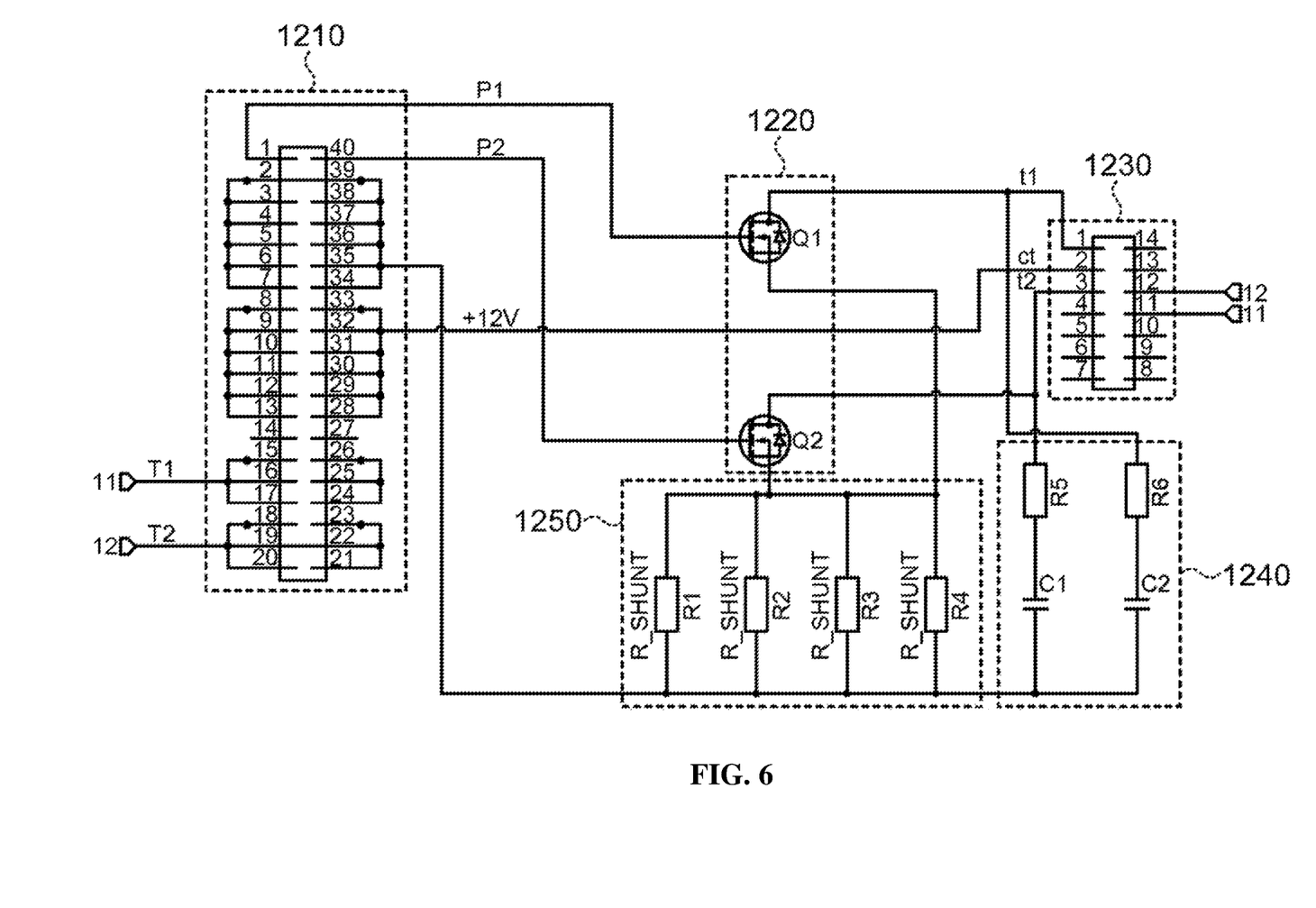
FIG. 6 is an exemplary diagram showing, in FIG. 5, sub-board circuits inserted into each of a plurality of female connectors formed in a motherboard.

FIG. 5 is an exemplary diagram showing a motherboard (or mainboard) circuit of an energy level conversion circuit for a portable energy storage apparatus according to an embodiment of the present disclosure, and FIG. 6 is an exemplary diagram showing, in FIG. 5, sub-board circuits (or converter board) inserted into each of a plurality of female connectors (or slots) formed in the motherboard.

Referring to FIG. 5, the motherboard (or mainboard) circuit includes a battery power input unit 1110, a power switch unit 1120, a switching pulse generation unit 1130, a current buffer unit 1140, a current regulation unit 1150, a female connector unit 1160, a rectification unit 1170, and a boosted power output unit 1180.

The battery power input unit 1110 receives the input of battery power, removes noise and outputs stable battery power (e.g., +12V). The noise free stable battery power (e.g., +12V) is used as a source of power for operating the energy level conversion circuit according to this embodiment.

The stable battery power (e.g., +12V) from which noise was removed through the battery power input unit 1110 is on-off controlled through the power switch unit 1120. That is, the power switch unit 1120 inputs or shuts off power to the energy level conversion circuit of this embodiment according to the user's selection.

The switching pulse generation unit 1130 generates a pair of switching pulses (i.e., switching pulses with opposite switching on-off ranges) P1, P2 for driving the switching unit 1220 of the sub-board (or the converter board) circuits shown in FIG. 6.

In this instance, the pair of switching pulses P1, P2 are a square wave pulse controlled by the Pulse Width Modulation (PWM) method, and to control the pulse width of the pair of switching pulses P1, P2, a reference may be made to a current value (e.g., a current value converted to voltage and outputted through a shunt resistor) detected through a current monitoring unit 1250 of the sub-board circuits shown in FIG. 6.

The pair of switching pulses P1, P2 generated by the switching pulse generation unit 1130 are applied to the sub-board circuits inserted into each female connector 1161-1163 of the female connector unit 1160 formed in the motherboard.

The current buffer unit 1140 reduces the influence of external noise on the pair of switching pulses P1, P2 outputted from the switching pulse generation unit 1130.

The current buffer unit 1140 includes a plurality of current buffers 1141-1143, each of which buffers each of the pair of switching pulses P1, P2 applied to the plurality of female connectors 1161-1163 of the female connector unit 1160.

The current regulation unit 1150 adjusts the influence of the pair of switching pulses P1, P2 outputted from the switching pulse generation unit 1130 on each switch Q1, Q2 of the switching unit 1220 of the sub-board circuits shown in FIG. 6.

For example, when the switching pulse is high, the current regulation unit 1150-1156 causes it to be applied to each switch Q1, Q2 through resistors, and when the switching pulse is low, the current regulation unit 1150-1156 causes voltage charged into gates of each switch Q1, Q2 to be released through diodes, and prevents an overcurrent from being applied to the gates of each switch Q1, Q2.

The current regulation unit 1150 includes a plurality of current regulation circuits 1151-1156, each of which regulates each switching pulse applied to each of the plurality of female connectors 1161-1163 of the female connector unit 1160.

The female connector unit 1160 includes the plurality of female connectors 1161-1163 into which the sub-board circuits shown in FIG. 6 are inserted.

In this instance, each female connector 1161-1163 includes a terminal for receiving the input of each of the pair of switching pulses P2, P2, terminal for receiving the input of the battery power (e.g., +12V), ground terminal GND and plurality of transformer tap connection terminals of the secondary side T1, T2.

Here, the plurality of transformer tap connection terminals of the secondary side are implemented by a series connection method. That is, the first transformer tap connection terminal of the secondary side T1 of the first female connector 1161 is connected to a first input terminal of the rectification unit 1170, the second transformer tap connection terminal of the secondary side T2 of the first female connector 1161 is connected to the first transformer tap connection terminal of the secondary side T1 of the second female connector 1162, the second transformer tap connection terminal of the secondary side T2 of the second female connector 1162 is connected to the first transformer tap connection terminal of the secondary side T1 of the third female connector 1163, and the second transformer tap connection terminal of the secondary side T2 of the third female connector 1163 is connected to a second input terminal of the rectification unit 1170.

As described above, the plurality of transformer tap connection terminals of the secondary side T1, T2 may be implemented by a series connection method to boost the voltage (i.e., energy) level. Although not shown in the drawing, it is noted that the plurality of the transformer tap connection terminals of the secondary side T1, T2 may be implemented by a parallel connection method to increase the current. That is, the plurality of transformer tap connection terminals of the secondary side T1, T2 of each female connector 1161-1163 may be implemented such that they are connected to the same input terminal of the rectification unit 1170.

For example, assume that the sub-board circuits shown in FIG. 6 connected (or inserted) to each female connector 1161-1163 of the female connector unit 1160 are a 200W converter circuit, when three sub-board circuits are all connected to the motherboard circuit shown in FIG. 5, the function of total 600W converter is achieved.

Meanwhile, when the sub-board circuits shown in FIG. 6 are connected (inserted) to only one or two female connectors, but not all the female connectors 1161-1163, and the female connector not connected (inserted) to the sub-board circuit directly connects the plurality of transformer tap connection terminals of the secondary side T1, T2 using a jump wire, it is possible to change the power (or energy) level to a desired level (i.e., a level corresponding to the number of sub-board circuits connected to each female connector) in an easy and simple way.

Of course, although not shown in the drawing, when a larger number of female connectors connected in series are connected to the sub-board circuits, it is possible to further expand the power (or energy) level (i.e., the level corresponding to the number of sub-board circuits connected to each female connector).

The rectification unit 1170 has the first input terminal connected to the first transformer tap connection terminal of the secondary side T1 of the first female connector 1161, and the second input terminal connected to the second transformer tap connection terminal of the secondary side T2 of the third female connector 1163.

Accordingly, the rectification unit 1170 wave-rectifies the voltage outputted through the first transformer tap connection terminal of the secondary side T1 of the first female connector 1161 and the second transformer tap connection terminal of the secondary side T2 of the third female connector 1163, and finally outputs DC power of which the level was converted (i.e., boosted) by the sub-board circuits through the boosted power output unit 1180.

Although not shown in the drawing, DC power outputted through the boosted power output unit 1180 is applied to the inverter unit (not shown) and converted to AC power.

Referring to FIG. 6, the sub-board circuits include a male connector unit 1210, a switching unit 1220, a transformer 1230, a snubber circuit 1240 and a current monitoring unit 1250.

The male connector unit 1210 connects (inserts) the sub-board circuits to each female connector 1161-1163 of the female connector unit 1160.

The switching unit 1220 includes switching transistors Q1, Q2 (e.g., MOS transistor) that are on/off when receiving the pair of switching pulses P1, P2 applied to the motherboard circuit through the gate.

One side (e.g., drain) of each switching transistor Q1, Q2 is connected to each of a first transformer tap of the primary side t1 and a second transformer tap of the primary side t2 of the transformer 1230, and the other side (e.g., source) is grounded.

Accordingly, as the switching transistors Q1, Q2 are on/off, battery power (+12V) applied to a center tap of the primary side ct of the transformer 1230 flows through the first switching transistor Q1 or the second switching transistor Q2.

In this instance, one side (e.g., drain) of each switching transistor Q1, Q2 is connected to the snubber circuit 1240 (i.e., circuit in which a resistor and a capacitor are connected in series) to reduce a reverse electromotive force (i.e., a reverse electromotive force higher than the internal pressure of the switching transistor) generated at the end of the coil when the current flowing to the transformer 1230 cuts off. Accordingly, it is possible to prevent the damage of the switching transistors Q1, Q2.

Additionally, each switching transistor Q1, Q2 has the current monitoring unit 1250 on the other side (e.g., source).

The transformer 1230 is a transformer that applies power (e.g., +12V) to the center tap ct on the primary side and causes the power applied to the center tap ct to flow through the first transformer tap of the primary side t1 and the second transformer tap of the primary side t2, and in this instance, outputs the wave voltage through a first transformer tap connection terminal of the secondary side T1 and a second transformer tap connection terminal of the secondary side T2.

Accordingly, as each switching transistor Q1, Q2 of the switching unit 1220 is on/off by the pair of switching pulses P1, P2 applied in the motherboard circuit shown in FIG. 5, the sub-board circuits shown in FIG. 6 output power transformed by the transformer 1230 through the transformer tap connection terminals of the secondary side T1, T2, and by series connection through the female connector unit 1160 of the motherboard circuit shown in FIG. 5, DC power boosted (i.e., converted energy level) as much as the number of sub-board circuits is outputted through the motherboard circuit shown in FIG. 5.

Figure 7:
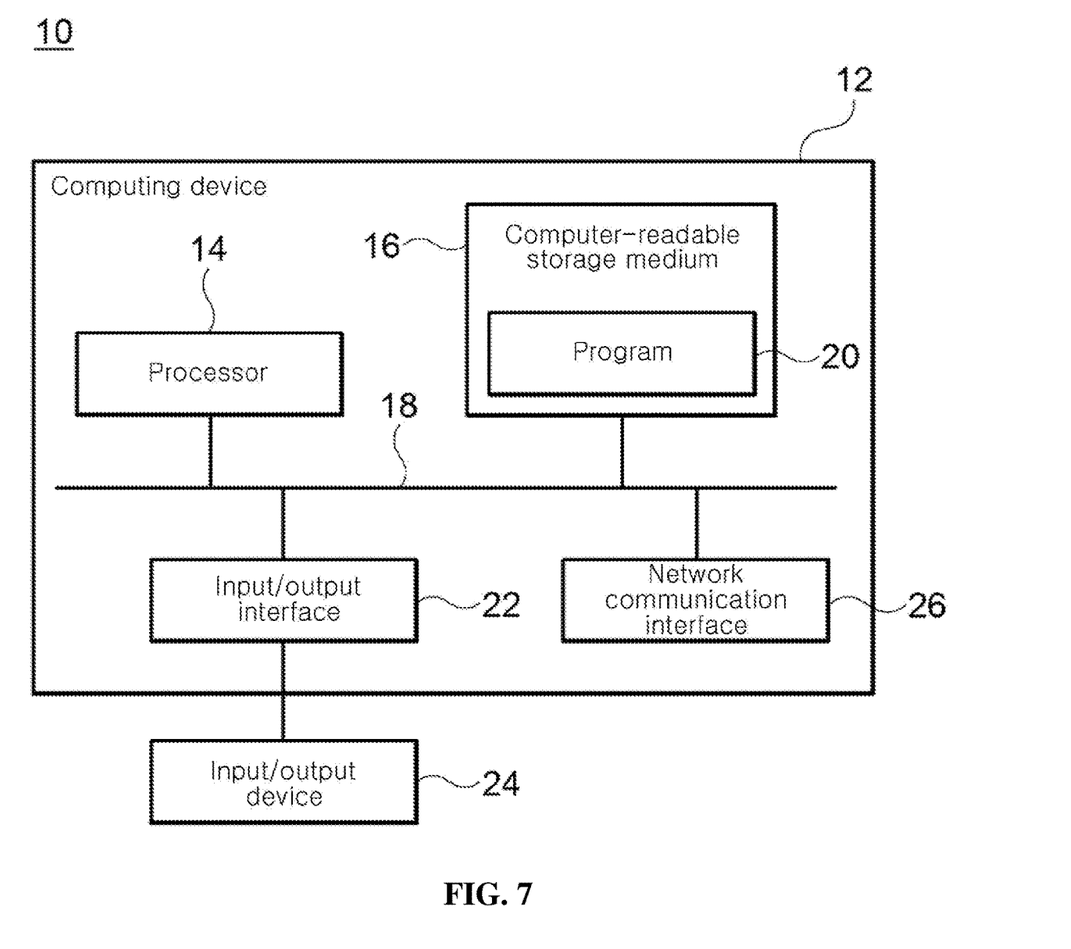
FIG. 7 is a block diagram exemplarily illustrating a computing environment including a suitable computing device for use in exemplary embodiments.

FIG. 7 is a block diagram exemplarily illustrating a computing environment 10 including a suitable computing device for use in exemplary embodiments. In the shown embodiment, each component may have functions and capabilities described below as well as other functions and capabilities, and in addition to the components described below, additional components may be included.

The shown computing environment 10 includes a computing device 12. In an embodiment, the computing device 12 may be a portable energy storage apparatus, or one or more components included in the portable energy storage apparatus.

The computing device 12 includes at least one processor 14, a computer-readable storage medium 16 and a communication bus 18. The processor 14 may allow the computing device 12 to operate according to the previously mentioned exemplary embodiment. For example, the processor 14 may execute one or more programs stored in the computer-readable storage medium 16. The one or more programs may include one or more computer executable instructions, and when the computer executable instructions are executed by the processor 14, may be configured to allow the computing device 12 to perform the operations according to an exemplary embodiment.

The computer-readable storage medium 16 is configured to store computer executable instructions or program codes, program data and/or other suitable types of information. The program 20 stored in the computer-readable storage medium 16 includes a set of instructions that can be executed by the processor 14. In an embodiment, the computer-readable storage medium 16 may be a memory (a volatile memory such as random access memory, a non-volatile memory, or their proper combination), one or more magnetic disk storage devices, optical disk storage devices, flash memory devices, other types of storage media that are accessed by the computing device 12 and can store desired information, or their proper combination.

The communication bus 18 includes the processor 14 and the computer-readable storage medium 16 to interconnect various components of the computing device 12.

The computing device 12 may also include at least one input/output interface 22 to provide an interface for at least one input/output device 24, and at least one network communication interface 26. The input/output interface 22 may include a scroll screen 102, an input interface 104 and an input screen 105 described above. The input/output interface 22 and the network communication interface 26 are connected to the communication bus 18. The input/output device 24 may be connected to other components of the computing device 12 through the input/output interface 22. Exemplary input/output device 24 may include input devices such as a pointing device (a mouse or a trackpad), keyboard, touch input device (a touch pad or a touchscreen), voice or sound input device, various types of sensor devices and/or an imaging device, and/or output devices such as a display device, printer, speaker and network card. The exemplary input/output device 24 may be included in the computing device 12 as one component of the computing device 12, and may be connected to the computing device 102 as a separate device that is distinguished from the computing device 12.

While the present disclosure has been hereinabove described with reference to the embodiments shown in the drawings, this is for illustration purposes only, and those having ordinary skill in the field to which the corresponding technology belongs will understand that a variety of modifications and other equivalents may be made thereto. Therefore, the technical protection scope of the present disclosure should be defined by the appended claims.

What is claimed is:

1. An energy level conversion circuit for a portable energy storage apparatus, comprising:
    a motherboard circuit comprising a female connector circuit having a plurality of female connectors to connect a plurality of sub-board circuits through the female connector circuit, wherein each of the plurality of sub-board circuits receive direct current (DC) power, convert the DC power to a preset energy level and output the converted DC power to the motherboard circuit; and
    the each of the plurality of sub-board circuits comprising a male connector circuit connected to a corresponding female connector of the female connector circuit, a transformer, and a switching circuit including a plurality of switching transistors,
    wherein the plurality of switching transistors is coupled between the male connector circuit and the transformer and is on/off when receiving a pair of switching pulses applied from the motherboard circuit,
    wherein the transformer transforms the DC power to a transformed power and the transformer is connected to receive the pair of switching pulses, and
    wherein when each of the plurality of the switching transistor is on/off, the transformed power is outputted through a pair of transformer tap connection terminals of a secondary side of each of the plurality of female connectors.

2. The energy level conversion circuit according to claim 1, wherein the plurality of sub-board circuits are connected in series through the female connector circuit of the motherboard circuit, and the DC power energy level is converted in reply to a number of the sub-board circuits and is outputted through the motherboard circuit.

3. The energy level conversion circuit according to claim 2, wherein the motherboard circuit further comprises a switching pulse generation circuit configured to generate the pair of switching pulses.

4. The energy level conversion circuit according to claim 3, wherein the pair of switching pulses are applied to the plurality of sub-board circuits connected to the each female connector, and
    wherein the each female connector comprises a terminal for receiving input of each of the pair of switching pulses, a terminal for receiving input of battery power, and a first transformer tap connection terminal of the secondary side and a second transformer tap connection terminal of the secondary side.

5. The energy level conversion circuit according to claim 4, wherein the first transformer tap connection terminal and the second transformer tap connection are connected in series through the plurality of female connectors of the motherboard circuit, and
    wherein the first transformer tap connection terminal of a first female connector of the plurality of female connectors is connected to a first input terminal of a rectification circuit disposed in the motherboard circuit, the second transformer tap connection terminal of the first female connector is connected to the first transformer tap connection terminal of a second female connector, the second transformer tap connection terminal of the second female connector is connected to the first transformer tap connection terminal of a third female connector, and the second transformer tap connection terminal of the third female connector is connected to a second input terminal of the rectification circuit.

6. The energy level conversion circuit according to claim 5, wherein the rectification circuit wave-rectifies voltage outputted through the first transformer tap connection terminal of the first female connector and the second transformer tap connection terminal of the third female connector, and outputs DC power whose energy level is converted by the plurality of sub-board circuits through a boosted power output circuit disposed in the motherboard circuit.

7. The energy level conversion circuit according to claim 5, wherein the pair of switching pulses are applied to gates of the each of the plurality of switching transistors, and
    wherein a snubber circuit is connected to drains of the each of the plurality of switching transistors.

8. The energy level conversion circuit according to claim 7, wherein the each of the plurality of switching transistors is a MOS transistor, the drains of the each of the plurality of switching transistors are connected to a first transformer tap of a primary side and a second transformer tap of the primary side of the transformer, and sources of the each of the plurality of switching transistors are grounded.

9. The energy level conversion circuit according to claim 1, wherein the transformer applies battery power to a center tap of a primary side of the transformer to allow the battery power applied to the center tap through a first transformer tap of the primary side and a second transformer tap of the primary side of the transformer to flow through a first switching transistor or a second switching transistor, and outputs wave voltage through a first transformer tap connection terminal and a second transformer tap connection terminal of the secondary side of the corresponding female connector.

10. The energy level conversion circuit according to claim 1, wherein the plurality of sub-board circuits are connected in parallel through the female connector circuit of the motherboard circuit, and wherein the DC power energy level is converted in reply to a sum of capacity of the each sub-board circuit connected in parallel and is outputted through the motherboard circuit.

\* \* \* \* \*